United States Patent [19]

Nakamura et al.

[11] Patent Number: 5,438,218
[45] Date of Patent: Aug. 1, 1995

[54] SEMICONDUCTOR DEVICE WITH SHOTTKY JUNCTION

[76] Inventors: Yoshio Nakamura; Shin Kikuchi; Shigeru Nishimura, all of c/o Canon Kabushiki Kaisha 30-2, 3-chome, Shimomaruko, Ohta-ku, Tokyo, Japan

[21] Appl. No.: 54,831

[22] Filed: Apr. 30, 1993

Related U.S. Application Data

[63] Continuation of Ser. No. 722,216, Jun. 27, 1991, abandoned.

[30] Foreign Application Priority Data

Jun. 29, 1990 [JP] Japan .................. 2-170065
Sep. 10, 1990 [JP] Japan .................. 2-240493

[51] Int. Cl.⁶ .................................. H01L 29/48
[52] U.S. Cl. ........................... 257/452; 257/473; 257/477; 257/476; 257/484
[58] Field of Search ............... 357/15, 30 C, 34, 35, 357/23.1, 23.14, 15 R, 15 P, 15 LA, 55; 257/452, 453, 471, 472, 473, 474, 476, 477, 478, 483, 484

[56] References Cited

U.S. PATENT DOCUMENTS

| | | | |
|---|---|---|---|
| 4,665,414 | 5/1987 | Koeneke et al. | 357/23.1 X |
| 4,952,992 | 8/1990 | Blanchard | 357/15 X |
| 5,040,034 | 8/1991 | Murakami et al. | 357/15 X |

FOREIGN PATENT DOCUMENTS

| | | | |
|---|---|---|---|
| 55-9428 | 1/1980 | Japan . | |
| 57-66660 | 4/1982 | Japan | 357/15 |
| 59-92575 | 5/1984 | Japan | 357/15 |
| 60-68661 | 4/1985 | Japan . | |
| 60-178670 | 9/1985 | Japan . | |
| 61-003470 | 1/1986 | Japan . | |
| 62-123716 | 6/1987 | Japan . | |
| 63-094675 | 4/1988 | Japan . | |
| 63-114167 | 5/1988 | Japan | 357/15 |
| 63-193571 | 8/1988 | Japan . | |
| 1023569 | 1/1989 | Japan . | |
| 2-51274 | 2/1990 | Japan . | |
| 2195663 | 4/1988 | United Kingdom . | |

OTHER PUBLICATIONS

Reidenbergs, "lateral PNP Transistor with Schohky Barrier Collector," *IBM technical Disclosure Bulletin*, vol. 14, No. 11, Apr. 1972, p. 3248.

Malaviya, "High-Speed PNP Transistors," *IBM Technical Disclosure Bulletin*, vol. 18, No. 3, Aug. 1975, pp. 735–736.

Anantha et al, "Method of Fabrication of Schohky Collector PNP," *IBM Technical Disclosure Bulletin*, vol. 21, No. 9, Feb. 1979, pp. 3630–3631.

Daughton, "Vertical Schohky Pad ," *IBM Technical Disclosure Bulletin*, vol. 15, No. 1, Jun. 1972, p. 261.

Journal of Vacuum Science and Technology, Part B, vol. 1, No. 3, Jul.–Sep. 1983, pp. 819–824, C. Barret, et al., "On the dependence of Schottky barrier height and interface states upon initial semiconductor surface parameters in GaAs (001)/Al Junctions".

*1988 Symposium On VLSI Technology Digest Of Technical Papers, 10th–13th May 1988, pp. 99–100*; Ohmi, T., et al.: "Copper ULSI Metallization by Low Kinetic-Energy Particle Process".

*Journal of Vacuum Science & Technology B*, vol. 7, No. 4, Jul./Aug. 1989, pp. 737–741, Chambers, S. A.: "Molecular-Beam Epitaxial Growth Of NiAl On GaAs(001)".

*Primary Examiner*—William Mintel

[57] ABSTRACT

A semiconductor device is provided having a first semiconductor region comprising an n-type semiconductor and a second semiconductor region of an n-type semiconductor having a higher resistivity than the first semiconductor region. An insulation film is provided adjacent to the semiconductor region having an aperture therein, and an electrode region is provided in the aperture. A third semiconductor region comprising a p-type semiconductor is provided at a junction between the insulation film and the electrode region. The electrode comprises a monocrystalline metal and constitutes a Schottky junction with the semiconductor region. An ohmic electrode comprising aluminum is arranged on the electrode region.

1 Claim, 7 Drawing Sheets

FIG. 1 PRIOR ART

OPERATION OF PNM ELEMENT

THERMAL EQUILIBRIUM CONDITION

FIG. 2 PRIOR ART

OPERATING CONDITION

FIG. 3 PRIOR ART

OPERATION OF PNP ELEMENT

THERMAL EQUILIBRIUM CONDITION

FIG. 4 PRIOR ART

OPERATING CONDITION

SEMICONDUCTOR DEVICE WITH SHOTTKY JUNCTION

This application is a continuation of application Ser. No. 07/722,216 filed Jun. 27, 1991, now abandoned.

BACKGROUND OF THE INVENTION

1. Field of the Invention

The present invention relates to a semiconductor device with a Schottky junction utilizing aluminum, and adapted for use in an integrated semiconductor circuit device.

2. Related Background Art

In the preparation of a conventional semiconductor device with a Schottky junction, such as a Schottky barrier diode, the aluminum film constituting a Schottky barrier with a semiconductor has been formed by sputtering or evaporation.

However such a conventional method has been associated with a first drawback that Al and Si constituting the Schottky barrier diode react by mutual diffusion in a thermal treatment of 400°-500° C. for forming an ohmic contact after the Al film formation. Also a second drawback lies in a fact that the breakdown voltage of such a diode is lower than that of a PN junction diode.

In the following an additional explanation will be given on the conventional semiconductor device having a Schottky junction.

Figure 1:
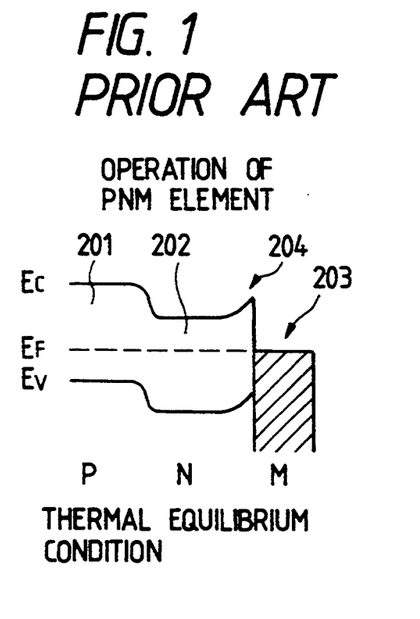
FIGS. 1 and 2 are band charts showing function states of a PNM device.
Figure 2:
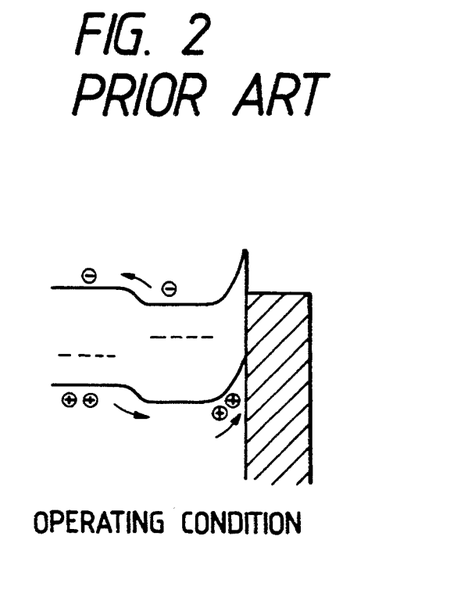
Figure 3:
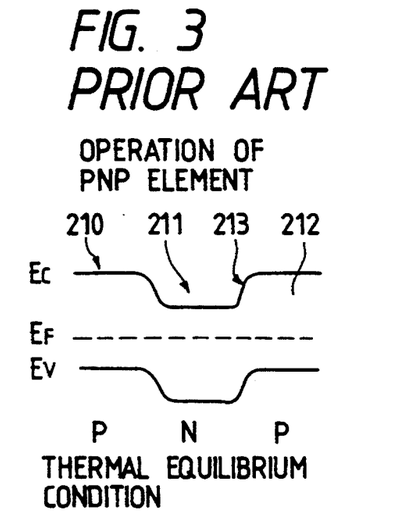
FIGS. 3 and 4 are band charts showing function states of a PNM device.
Figure 4:
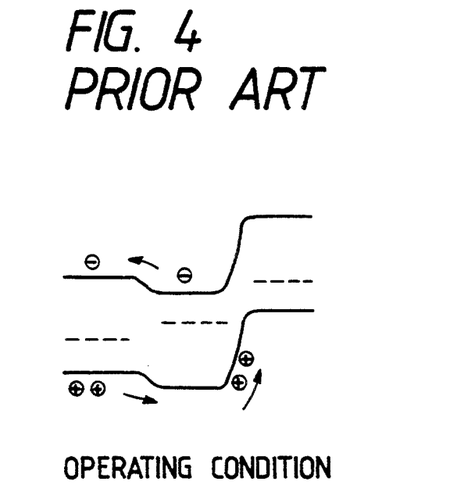
Figure 5:
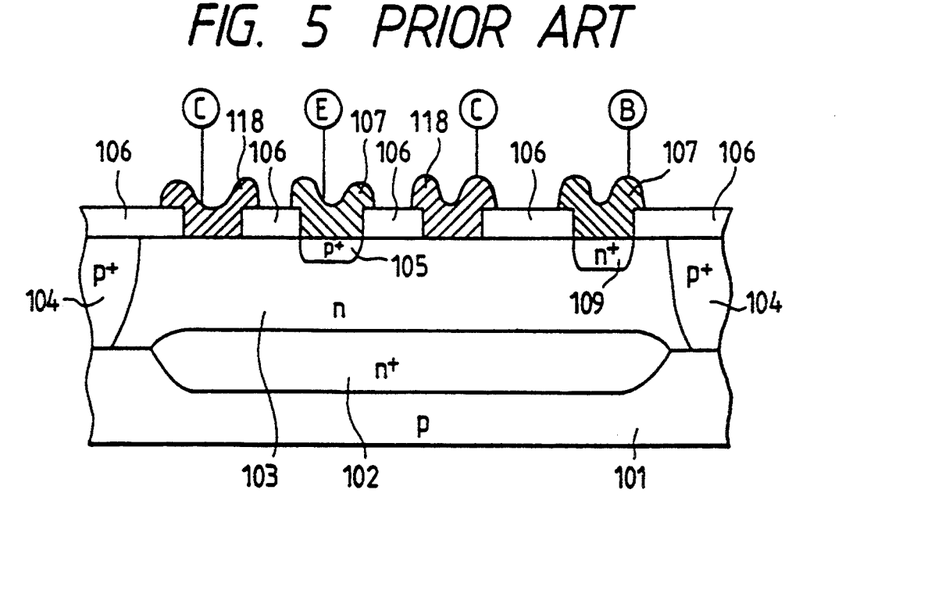
FIG. 5 is a longitudinal partial cross-sectional view of a conventional PNP semiconductor device.

A so-called PNM type semiconductor device, which a modification of lateral PNP semiconductor device, is so designed to concentrate the current in a Schottky junction formed in a portion corresponding to the collector of the lateral PNP device, thereby realizing a function equivalent to that in the ordinary PNP device. FIGS. 1 and 2 are band charts showing the function states of a PNM device, while FIGS. 3 and 4 are band charts showing the function states of a PNP device, wherein shown are an emitter 201, 210; a base 202, 211; a collector 203, 212; and a depletion layer 204, 213 between the collector and the base. The movement of the positive holes, functioning as the principal carriers, is the same in both devices. FIG. 5 illustrates a conventional PNM semiconductor device, wherein shown are semiconductor substrate 101 for example of p-type; an n+ buried layer 102 constituting the collector; an n-epitaxial layer 103 constituting the actual device; an isolation area 104; a diffused emitter area 105; emitter and base electrodes 107; Schottky electrodes 118 composed for example of aluminum for constituting Schottky junctions with the epitaxial layer 103; an insulation layer 106 composed for example of SiO$_2$ for insulating the emitter, base electrodes 107 and the metal layers 118 from the semiconductor surface; and a diffusion layer 109 for electrical connection with the base electrode 107.

Figure 6:
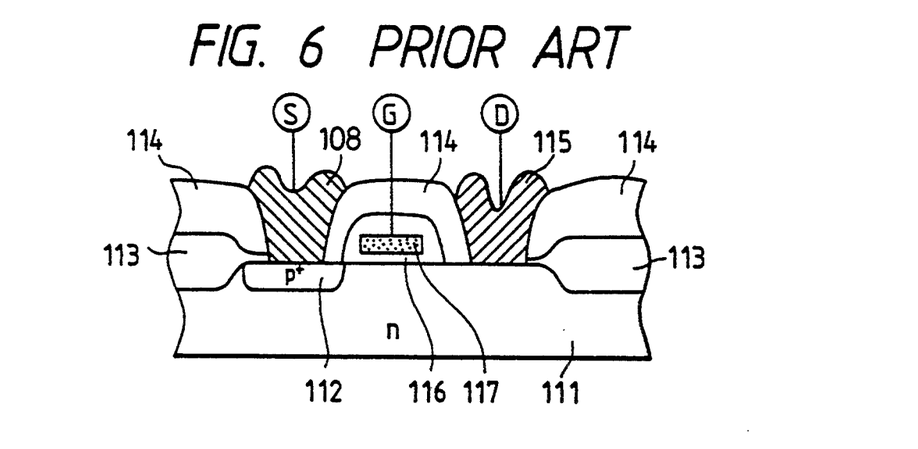
FIG. 6 is a longitudinal cross-sectional view of a conventional structure in which a Schottky junction is utilized in a drain portion.

Also FIG. 6 shows a conventional structure in which a Schottky junction is utilized in the drain portion, wherein shown are an n-type semiconductor substrate 111; a diffusion layer 112 constituting a source area; an isolation oxide film 113 formed for example by LOCOS (local oxidation of silicon); an insulation layer 114 composed, for example, of phosphor glass; a Schottky electrode 115 composed, for example, of Al; a gate oxide film 116; a gate electrode 117; and a source electrode 108.

Figure 7:
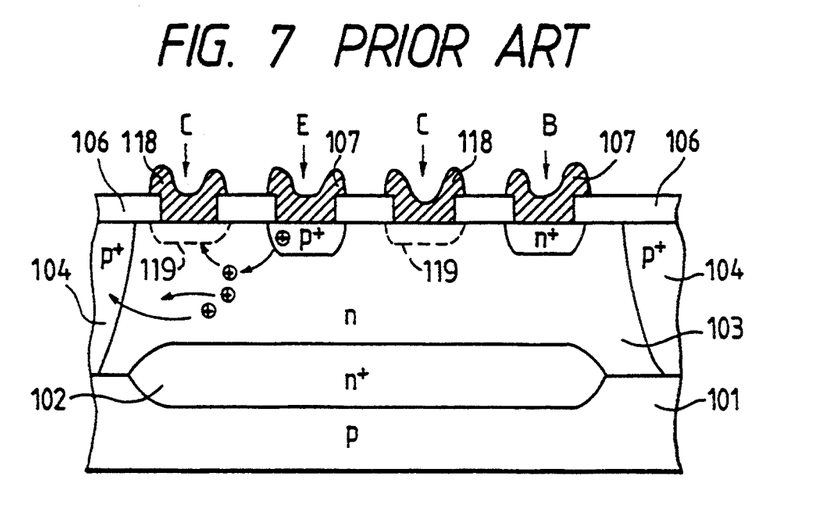
FIG. 7 is a cross-sectional view showing the function of the conventional semiconductor device shown in FIG, 5.

The conventional PNM semiconductor device shown in FIG. 5 has been associated with a drawback of an extremely low current collecting efficiency because of a planar structure of the Schottky junction. As shown in FIG. 7, the depletion layer 119 generated at the Schottky junction (collector) is concentrated in the surface area of the device and is therefore unable to efficiently collect the carriers diffusing from the emitter, so that the carriers leak to the device isolation area, leading to a lowered current gain. It is also necessary to effect control on the silicon substrate so as to realize satisfactory interface characteristics.

Figure 8:
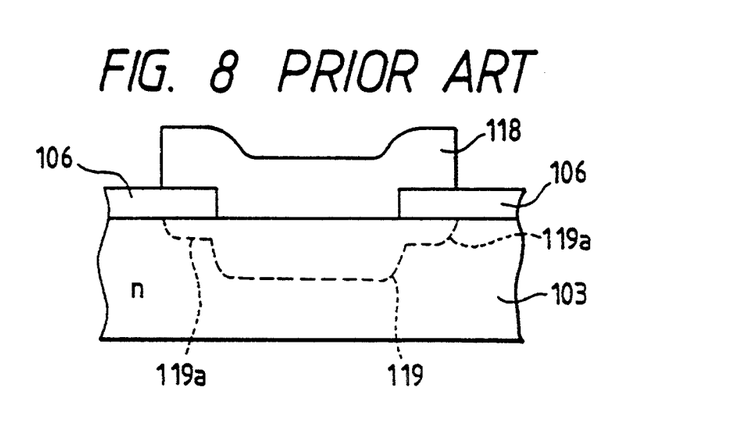
FIGS. 8 and 9 are schematic views showing a depletion layer formed in conventional semiconductor devices.
Figure 9:
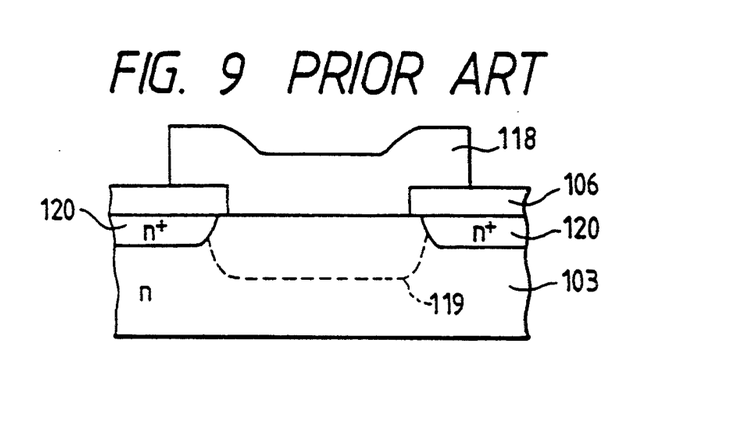

Also as shown in FIG. 8 which is a magnified view of FIG. 7, the depletion layer 119 generates a protruding portion 119a extending along the surface of the device, thus forming a generation/recombination (G-R) area and hindering the improvement in the device characteristics. It is also conceived, in order to prevent such drawback, to form a highly doped layer 120 in a position corresponding to said protruding portion 119a as shown in FIG. 9, but a significant improvement in the characteristics cannot be expected with such structure since the area of the depletion layer 119 is inevitably limited.

SUMMARY OF THE INVENTION

In consideration of the foregoing, a principal object of the present invention is to provide a semiconductor device capable of a high-speed rectifying operation and a method for producing the same.

Another object of the present invention is to provide a highly reliable semiconductor device of satisfactory performance and a sufficiently high breakdown voltage with a low cost.

Still another object of the present invention is to provide a semiconductor device having a metal electrode constituting a Schattky junction, formed by a CVD process utilizing alkylaluminum hydride and hydrogen.

Still another object of the present invention is to provide a semiconductor device having a Schottky junction consisting of a monocrystalline metal and a semiconductor area.

Still another object of the present invention is to provide a semiconductor device in which a Schottky junction is formed by burying metal in a recess formed in a semiconductor area.

BRIEF DESCRIPTION OF THE DRAWINGS

FIG. 7 is a schematic cross-sectional view of a Schottky barrier diode embodying the present invention;

DETAILED DESCRIPTION OF THE PREFERRED EMBODIMENTS

According to a preferred embodiment of the present invention, there is provided a semiconductor device having a Schottky junction consisting of a metal electrode and a semiconductor area, wherein said metal electrode is formed by a single crystal principally composed of Al.

The foregoing objects can be attained by a method for producing a semiconductor device, in which a Schottky electrode area is formed by a chemical vapor deposition (CVD) process utilizing alkylaluminum hydride gas and hydrogen.

The present invention enables the preparation of a Schottky barrier diode in a well controlled and uniform manner by controlling the reaction between Al and Si, by selectively burying monocrystalline aluminum in a constant hole, utilizing the CVD process utilizing alkylaluminum hydride and hydrogen, called Al-CVD process.

[First Embodiment]

Figure 10:
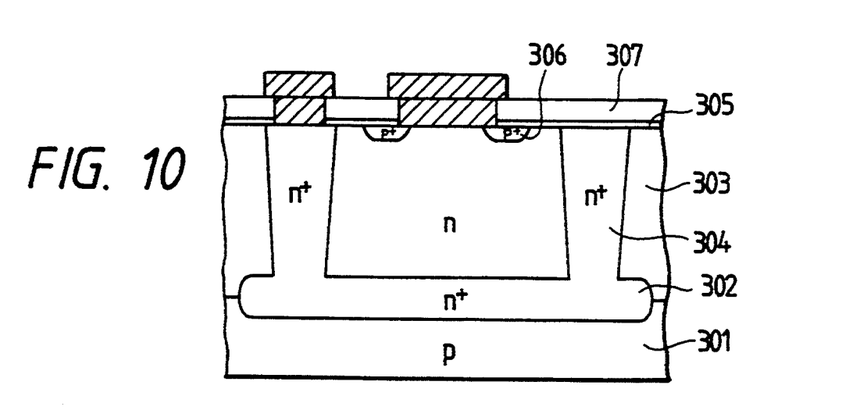

FIG. 10 illustrates a semiconductor device having a Schottky junction embodying the present invention, provided with:

a first semiconductor area of an n-type semiconductor;

a second semiconductor area of an n-type semiconductor of having a high resistance than in said first semiconductor area;

an insulation film provided adjacent to said second semiconductor area and having an aperture;

an electrode area formed in the area of said aperture; and a third semiconductor area of a p-type semiconductor formed at the junction of said insulation film and said electrode area;

wherein said electrode area is composed of monocrystalline aluminum constituting a Schottky junction with said second semiconductor area.

FIG. 10 illustrates, as an example of the semiconductor device having Schottky junction, a Schottky barrier diode.

On a p-type semiconductor substrate 301 there is formed a buried layer 302, on which an n-type layer 303 is epitaxially grown. From the principal surface of the substrate there is formed an n+ layer 304 for contacting with the buried layer 302, and said n+ layer is in ohmic contact with an upper cathode electrode.

On the n layer 303 there are provided silicon oxide layers 305, 307, in which an aperture is formed to locally expose the n layer 303. A monocrystalline Al is formed therein to constitute a Schottky junction with said n layer 303. A p+-layer 306 is formed below and across the boundary between the anode electrode consisting of said monocrystalline Al, and the silicon oxide insulation layer 305.

Since the anode electrode in contact with the n-layer 303 including the junction thereof with the p+-layer 306 is formed by monocrystalline aluminum, the interface characteristics are improved to provide a satisfactory Schottky junction.

Figure 11A:
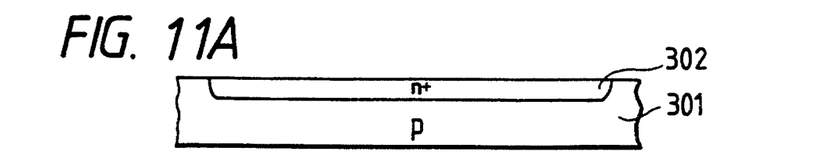
FIGS. 11A to 11D are schematic cross-sectional views showing the method for producing the Schottky barrier diode embodying the present invention.
Figure 11B:
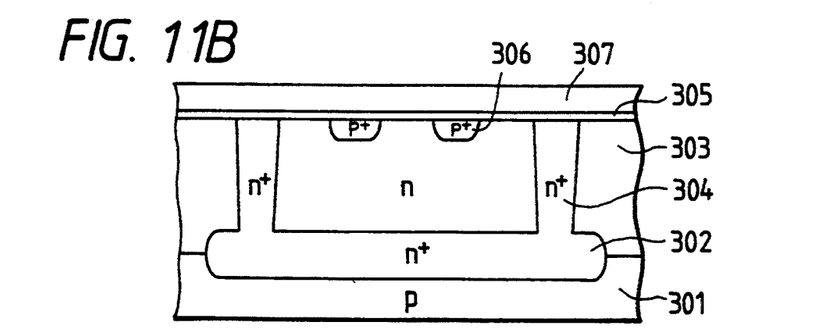

Now reference is made to FIGS. 11A to 11D for explaining the method for producing the Schottky barrier diode of the present invention utilizing aluminum film. At first, on a semiconductor substrate 301, there is formed an n+-layer 302 of a high impurity concentration, as a buried layer for reducing the serial resistance (FIG. 11A). Then an n-semiconductor layer 303 is epitaxially grown. The impurity concentration is such as to form a Schottky junction with aluminum and is preferably $5 \times 10^{16}/cm^3$ or lower. Subsequently an n+-layer 304 of a high impurity concentration is formed for reducing the serial resistance, and a thin thermal oxide film 305 of 300–500 Å is formed in the device forming area. Then a p+-layer 306 is formed thereon by ion implantation in order to secure the inverse voltage resistance of the Schottky barrier diode, and an interlayer insulation film 307 of a thickness of 3000–8000 Å is formed by a CVD process (FIG. 11B).

Figure 11C:
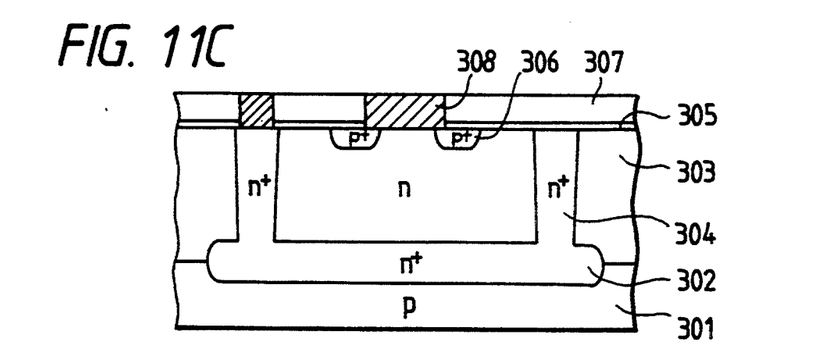
Figure 11D:
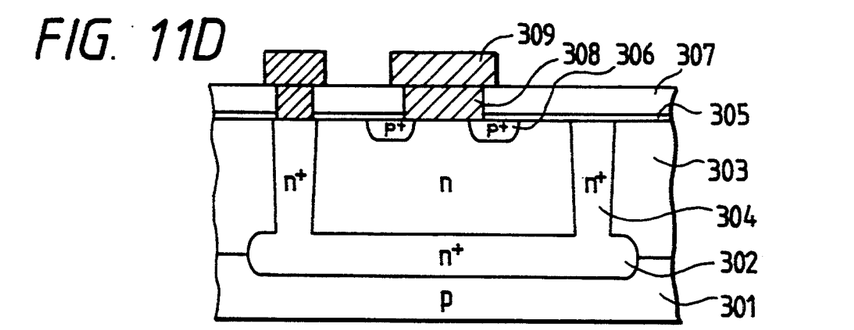

Then contact holes are formed by opening the interlayer insulation film 307 and the thermal oxide film 305 in desired positions by an ordinary photolithographic process, and aluminum for forming wiring electrodes is selectively grown in said contact holes by a CVD process to be explained later. The aluminum film formation is conducted, in a reaction chamber evacuated to a pressure of $5 \times 10^{-3}$ Torr or lower, by introduction of dimethylaluminum hydride (DMAH) with $H_2$ as carrier gas, with a total pressure of 0.5–760 Torr, preferably 0.1 to 0.8 Torr with a DMAH partial pressure of $1 \times 10^{-5}$ to $1.3 \times 10^{-3}$ times of the total pressure and with a substrate temperature of 270°–350° C. The formed Al film 308 grows as a single crystal selectively in the contact hole, and can fill in the contact hole with flat top surface (FIG. 11C). After the contact holes are filled with aluminum, an Al film of a thickness of 4000–12000 Å is formed by sputtering with a substrate temperature of 100°–500° C. without breaking the vacuum condition, and is subsequently patterned by a photolithographic process to form wiring electrodes 309.

The use of monocrystalline Al obtained by the above-explained CVD process in the Al electrodes of the Schottky barrier diode suppresses the reaction between Al and Si of the substrate, thereby providing the following advantages:

1) well-controlled Schottky characteristics;
2) reduced device-to-device fluctuation; and
3) semiconductor device of high reliability, capable of high-speed operation, can therefore be obtained with a high production yield.

[Second Embodiment]

A second embodiment of the present invention provide a semiconductor device having a Schottky junction, capable of forming a depletion layer of a desired shape without reducing the area thereof, thereby achieving a significant improvement in the performance.

More specifically, the semiconductor device of the second embodiment includes a structure in which the substrate is provided with a recess at a position where the Schottky junction is to be formed, and a part of a metal layer is positioned in said recess.

According to said second embodiment, the Schottky electrode penetrates to a predetermined depth in the epitaxial layer, so that the depletion layer reaches the deep part of said epitaxial layer. Thus the carriers diffusing from the emitter can be efficiently captured and an improvement in gain can therefore be attained.

The second embodiment will now be explained in greater detail, with reference to FIG. 12, wherein shown are a semiconductor substrate 1; a buried layer 2; a device isolation layer 3; a diffused portion 4 of the emitter; a diffusion layer 5 for ohmic contact with the base electrode 7; base and emitter electrodes 7; a Schottky electrode 8 constituting a collector; an insulation layer 6 composed for example of $SiO_2$ for insulating the semiconductor substrate 1 from the electrodes 7, 8; and an epitaxial layer 9.

The electrodes 7 are in contact with the surface of the semiconductor substrate 1, while the electrodes 8 penetrate in recesses 10 formed on the surface of the semiconductor substrate 1, and form Schottky junctions between the end faces and the epitaxial layer 9.

Figure 13:
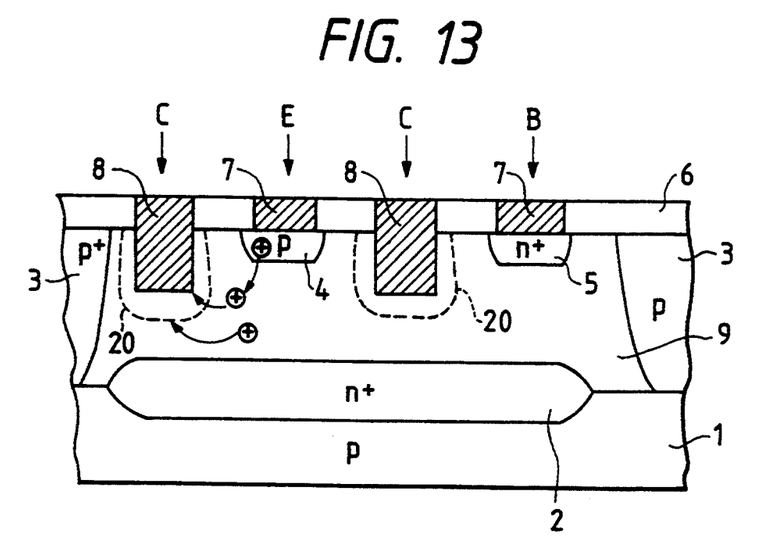
FIG. 13 is a cross-sectional view showing the function of the semiconductor device shown in FIG. 12.

Now reference is made to FIG. 13 for explaining the function of the semiconductor device explained above. In said device, since the Schottky electrodes 8 penetrate to a predetermined depth in the epitaxial layer 9, the depletion layer 20 reaches the deeper part of the epitaxial layer 9 as will be apparent from the comparison with the conventional device shown in FIG. 7, whereby the carriers diffusing from the emitter can be efficiently captured by the collector and an improvement in the gain can be attained.

Figure 12:
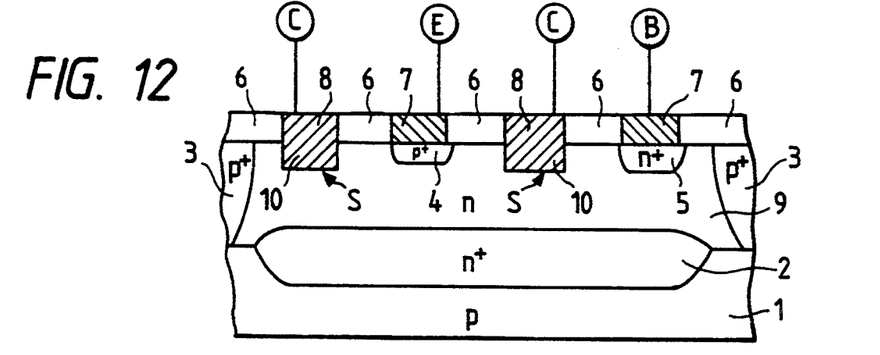
FIG. 12 is a longitudinal partial cross-sectional view of a semiconductor device constituting a second embodiment of the present invention.
Figure 14A:
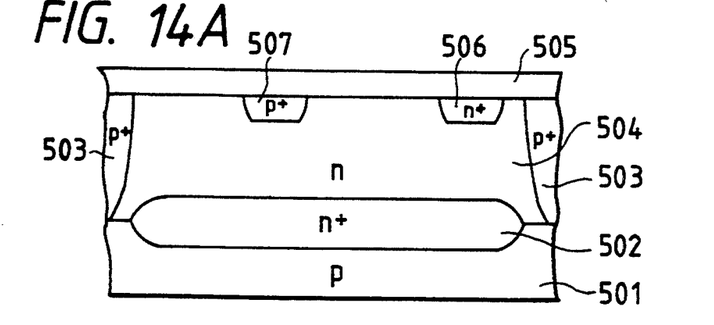
FIGS. 14A to 14D are schematic views showing the method for producing the semiconductor device shown in FIG. 12.
Figure 14B:
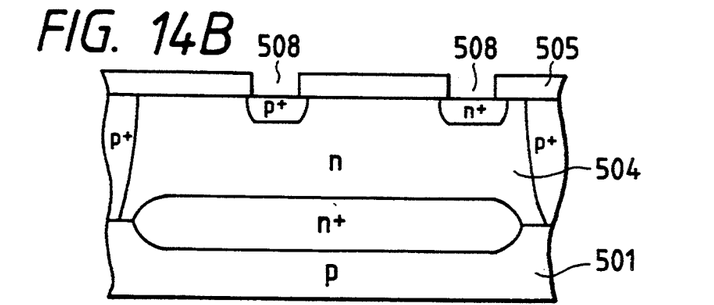
Figure 14C:
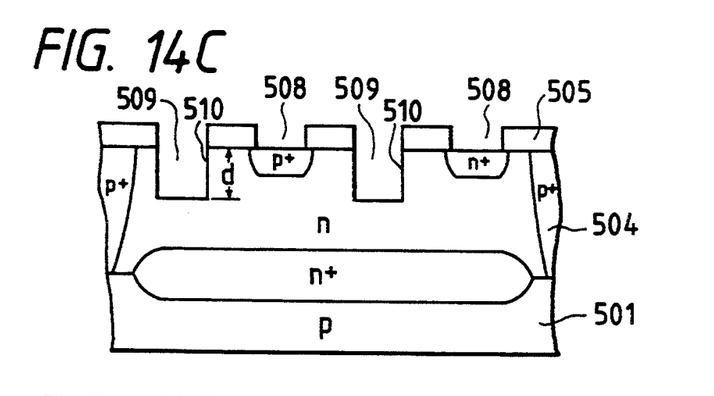
Figure 14D:
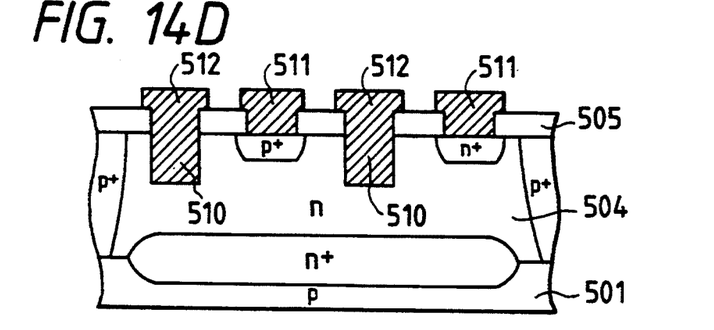

FIGS. 14A to 14D illustrate an example of the method for producing the semiconductor device shown in FIG. 12. In FIG. 14A there are shown a semiconductor substrate 501; a buried layer 502 constituting a part of the base; an epitaxial layer 504 constituting a device forming layer; a device isolation layer 503; a surface protective film 505; a diffusion layer 506 forming a contact to the base; and a diffusion area 507 serving as an emitter. The diffusion layers 506,507 constituting the base and the emitter are formed according to an ordinary method. Then contact holes 508 are formed in the surface protective film 505 by a photolithographic process and an etching process (FIG. 14B), and recesses 509 are formed again by a photolithographic process and an etching process. Said recesses 509 penetrates the surface protective film 505 and reach a depth d from the surface of the epitaxial layer 504. Finally, base and emitter electrodes 511 and collector electrodes 512 are formed in the contact holes 508 and the recesses 509 (FIG. 14D).

The collector electrodes 512 for forming Schottky barriers can be formed by the Al-CVD process mentioned above. More specifically, a substrate to be subjected to the Al film formation is placed in a loading chamber, of which atmosphere is replaced by hydrogen gas. An adjacent reaction chamber is evacuated to a pressure of ca. $1 \times 10^{-8}$ Torr. Into said reaction chamber there are introduced dimethylaluminum hydride (Al(CH$_3$)$_2$H: DMAH) with hydrogen as carrier gas, through a first gas line, and hydrogen gas as reaction gas through a second gas line. DMAH and hydrogen gas react in the reaction chamber, and the reacted gas contacts the substrate in the loading chamber. Said substrate is heated to about 270° C. generally by lamps, and aluminum is deposited onto the substrate surface in this state. The Al-CVD process causes selective aluminum deposition in the grooves present on the substrate surface, providing satisfactory Al deposited film.

[Third Embodiment]

Figure 15:
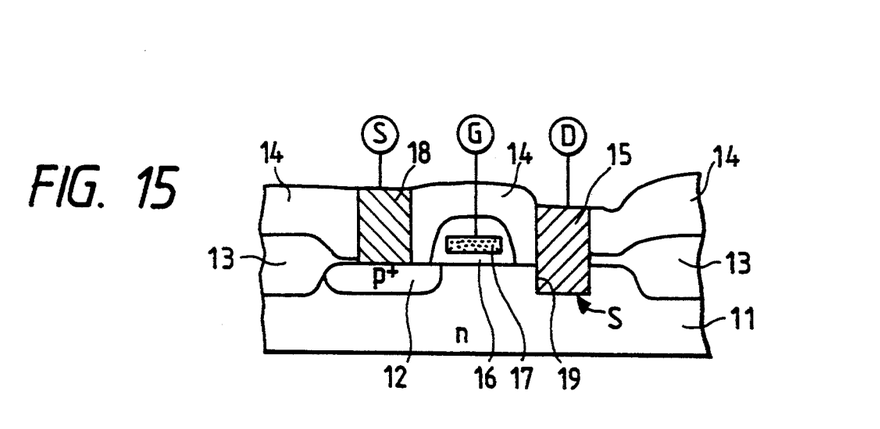
FIG. 15 is a longitudinal partial cross-sectional view of a semiconductor device constituting another embodiment of the present invention.

FIG. 15 illustrates an embodiment of the present invention applied to a field effect transistor wherein shown are an epitaxial layer 11 formed on a semiconductor substrate; a diffusion layer 12 constituting a source; a device isolation area 13 formed by LOCOS; an insulation layer 14 composed for example of phosphate glass; a drain electrode 15; a gate insulation film 16; a gate electrode 17; and a Schottky electrode 18 constituting a source. The drain electrode 15 is composed of a metal, such as aluminum, constituting a Schottky barrier, and partly penetrates into a recess 19 formed in the epitaxial layer 11. Also in the semiconductor device of the present embodiment, as in the case of FIG. 13, the Schottky junction S is formed in the deep part of the epitaxial layer 11, so that the carriers diffusing from the source can be efficiently collected by the drain and an improvement in the gain can therefore be attained. The Schottky barrier may be formed of other metals than aluminum, such as Pt, W, Mo, Ni, Ti, Mn or Ta.

Figure 16:
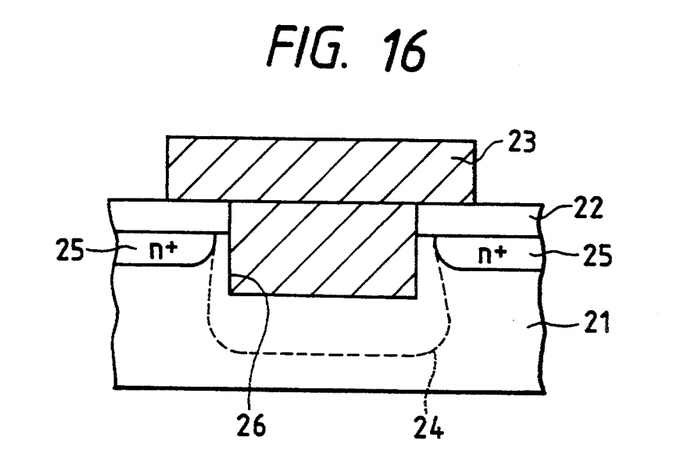
FIG. 16 is a longitudinal partial cross-sectional view of a semiconductor device constituting still another embodiment of the present invention.

Also in a structure shown in FIG. 16, provided with an epitaxial layer 21, an insulation layer 22 and a Schottky electrode 23 penetrating into a recess 26, there may be formed a high impurity concentration layer 25 around said electrode 23. Also in this case, a depletion layer 24 is formed, reaching the deep part of the epitaxial layer 21, thereby reducing the surface G-R area without a significant decrease in the carrier collecting area.

The semiconductor devices of the second and third embodiments have the effect of significantly improving the probability of capturing the carriers, diffusing from the emitter, by the collector, thereby attaining an improvement in the current gain, as the Schottky electrode penetrates to a predetermined depth in the epitaxial layer and the depletion layer formed therearound reaches the deep part of said epitaxial layer.

The Al-CVD process employed for forming the Schottky electrode provides particularly satisfactory interface characteristics, thus allowing to obtain a satisfactory Schottky junction, and facilitates the control of preparation of the device.

[Description of preparation method]

In the following there will be outlined the method for producing the Schottky electrode, adapted for use in the present invention.

[Film forming method]

In the following there will be explained a method for forming a metal film composed solely or principally of aluminum, adapted for use in the present invention, said method being called Al-CVD process.

This method is suitable for filling a fine and deep aperture with an aspect ratio of 1 or larger, such as a contact hole or a through hole, with a metal material, and is characterized by a splended selectivity.

The metal film formed by this method is characterized by splendid crystallinity, such as monocrystalline aluminum, and is almost free from carbon inclusion.

Said metal film has excellent surface characteristics, with a resistivity as low as 0.7 to 3.4 $\mu\Omega\cdot$cm, a reflectance as high as 85 to 95%, and a density of hillocks equal to 1 $\mu$m or larger in a range of 1 to 100 cm$^{-2}$.

Also the probability of generation of alloy spikes at the interface with silicon, represented by the probability of destruction of semiconductor junction of 0.15 $\mu$m, is almost equal to zero.

More specifically, said method consists of forming a deposition film by a surface reaction, on an electron-donating substrate, utilizing alkylaluminum hydride gas and hydrogen gas. An aluminum film of particularly satisfactory quality can be deposited by employing mono-methylaluminum hydride (MMAH) or dimethylaluminum hydride (DMAH) as the raw material gas and hydrogen as the reaction gas, and heating the substrate surface in the presence of a mixture of these transistor.

At the selective deposition of aluminum, the substrate surface is preferably heated, either by direct or indirect heating, to a temperature range at least equal to the decomposition temperature of alkylaluminum hydride but lower than 450° C., more preferably within a range from 260°–440° C.

The substrate may be heated to the abovementioned temperature range either by indirect or direct heating, but an aluminum film of satisfactory quality can be obtained with a particularly high deposition speed if the substrate is maintained within the above-mentioned temperature range by direct heating. For example, when the substrate surface temperature is maintained within the more preferred range of 260°–440° C. by direct heating, a satisfactory film can be obtained with a deposition speed of 3000–5000 Å/min., which is higher than the deposition speed obtainable with resistance heating. Such direct heating, in which the substrate is heated by direct energy transfer from heating means, is for example achieved by heating with lamps, such as halogen lamps or xenon lamps. The indirect heating can for example be achieved by resistance heating, utilizing a heat generating member provided in a substrate support member, provided for supporting the substrate for film formation in a film forming chamber.

This method, when applied to a substrate having both an electron donating surface area and an electron non-donating surface area, forms monocrystalline aluminum with a satisfactory selectivity, solely on the electron donating surface area.

The electron donating material means a material in which free electrons are present or intentionally generated, and which has a surface capable of accelerating a chemical reaction by electron transfer with molecules of the raw material gas deposited onto said surface. Metals and semiconductors generally fall into this category. Also metals and semiconductors having a thin surface oxide film are included in the electron donating materials of the present invention, since a chemical reaction can be induced by electron transfer between the substrate and the raw material molecules deposited thereon.

Examples of the electron donating material include III-V compound semiconductors of two-, three- or multi-element system obtained by combining element(s) of group III such as Ga, In, Al etc. with element(s) of group V such as P, As, N etc.; semiconductors such as mono-crystalline or amorphous silicon; and metals, alloys and silicides such as tungsten, molybdenum, tantalum, copper, titanium, aluminum, titanium-aluminum, titanium nitride, aluminum-silicon-copper, aluminum-palladium, tungsten silicide, titanium silicide, aluminum silicide, molybdenum silicide and tantalum silicide.

On the other hand, example of the electron non-donating material, constituting a surface not inducing selective deposition of Al or Al-Si, include silicon oxide formed by thermal oxidation or by CVD; glass materials such as BSG, PSG and BPSG; oxide films; thermal nitride films; and a silicon nitride film formed by plasma CVD, low pressure CVD, or ECR-CVD.

Said Al-CVD method can also deposit have following metal films principally composed of aluminum, with satisfactory film quality.

For example there can be achieved selective deposition of a conductive material for electrode formation, such as Al-Si, Al-Ti, Al-Cu, Al-Si-Ti or Al-Si-Cu by employing a mixed gaseous atmosphere containing a suitable combination, in addition to alkylaluminum hydride gas and hydrogen, of:

Si-containing gas such as SiH$_4$, Si$_2$H$_6$, Si$_3$H$_8$, Si(CH$_3$)$_4$, SiCl$_4$, SiH$_2$CL$_2$, SiHCl$_3$ etc.;

Ti-containing gas such as TiCl$_4$, TiBr$_4$, Ti(CH$_3$)$_4$ etc.; and

Cu-containing gas such as copper bisacetylacetonate (Cu(C$_5$H$_7$O$_2$)$_2$), copper bispyvaloylmethanite (Cu(C$_{11}$H$_{19}$O$_2$)$_2$), copper bishexafluoroacetyl-acetonate (Cu(C$_5$HF$_6$O$_2$)$_2$ etc.

Also since said Al-CVD method is capable of film formation with excellent selectivity and with satisfactory surface characteristics of the obtained film, there may be employed non-selective film forming method in the succeeding film deposition to obtain a metal film solely or principally composed of aluminum both on the selectively deposited aluminum film and on the SiO$_2$ insulation film, thereby obtaining a metal film generally usable as wirings for the semiconductor devices.

Such metal film can be obtained by the combinations of non-selectively deposited Al, Al-Si, Al-Ti, Al-Cu, Al-Si-Ti or Al-Si-Cu and selectively deposited Al, Al-Si, Al-Ti, Al-Cu, Al-Si-Ti or Al-Si-Cu.

Said non-selective film deposition can be achieved for example by a CVD method other than the above-explained Al-CVD method, or by sputtering.

The wirings may also be formed by forming a conductive film by CVD or sputtering, patterning said film to obtain a sub layer of a form of desired wirings, and selectively depositing aluminum or a metal principally composed of aluminum on said sub layer by the Al-CVD method.

Furthermore a metal may be deposited on an insulation film by the Al-CVD method. For this purpose the insulation film is subjected to a surface modification to form a substantially electron-donating surface area. In this operation a pattern of desired wirings may be drawn with a beam, whereby the film is selectively deposited only on the electron-donating area obtained by said beam drawing, and the wirings can be obtained in a self-aligned manner without the patterning operation.

We claim

1. A semiconductor device, comprising:
    a first semiconductor region comprising an n-type semiconductor;

a second semiconductor region comprising an n-type semiconductor having a higher resistivity than said first semiconductor region;

an insulation film provided adjacent to said second semiconductor region having an aperture therein;

an electrode region provided in said aperture; and a third semiconductor region comprising a p-type semiconductor provided at a junction between said insulation film and said electrode region, wherein said electrode region consists essentially of monocrystalline aluminum and constitutes a Schottky junction with said second semiconductor region.

* * * * *

UNITED STATES PATENT AND TRADEMARK OFFICE
CERTIFICATE OF CORRECTION

PATENT NO. : 5,438,218
DATED : August 1, 1995
INVENTOR(S) : Yoshio Nakamura, et. al.

It is certified that error appears in the above-indentified patent and that said Letters Patent is hereby corrected as shown below:

On the title page,

AT [73] ASSIGNEE

Insert --[73] Assignee: Canon Kabushiki Kaisha, Tokyo, Japan--.

AT TITLE

"SHOTTKY" should read --SCHOTTKY--.

AT [75] INVENTORS

"[76] Inventors: Yoshio Nakamura; Shin Kikuchi; Shigeru Nishimura, all of c/o Canon Kabushiki Kaisha 30-2, 3-chome, Shimomaruko, Ohta-ku, Tokyo, Japan" should read --[75] Inventors: Yoshio Nakamura, Atsugi; Shin Kikuchi, Isehara; and Shigeru Nishimura, Hiratsuka, all of Japan--.

AT [56] REFERENCES CITED

Foreign Patent Documents,
"1023569  1/1989  Japan" should read
--1-23569  1/1989  Japan--.

Other Publications,
At Reidenbergs,
"Reidenbergs," should read --Zeidenbergs,-- and "Schohky" should read --Schottky--.
At Anantha et al, "Schohky" should read --Schottky--.
At Daughton, "Schohky" should read --Schottky--.

UNITED STATES PATENT AND TRADEMARK OFFICE
CERTIFICATE OF CORRECTION

Page 2 of 3

PATENT NO. : 5,438,218
DATED : August 1, 1995
INVENTOR(S) : Yoshio Nakamura, et. al.

It is certified that error appears in the above-indentified patent and that said Letters Patent is hereby corrected as shown below:

Before [57] Abstract, insert --Attorney, Agent, or Firm--Fitzpatrick, Cella, Harper, & Scinto--

COLUMN 1

Line 2, "SHOTTKY" should read --SCHOTTKY--.

COLUMN 2

Line 54, "PNM" should read --PNP--.
Line 66, "FIG. 7" should read --FIG. 10--.

COLUMN 3

Line 48, "high" should read --higher--.

COLUMN 5

Line 53, "penetrates" should read --penetrate--.

COLUMN 6

Line 68, "splended" should read --splendid--.

COLUMN 7

Line 2, "splended" should read --splendid--.
Line 20, "tran-" should read --gases.--.
Line 21, "sistor." should be deleted.

UNITED STATES PATENT AND TRADEMARK OFFICE
CERTIFICATE OF CORRECTION

PATENT NO. : 5,438,218
DATED : August 1, 1995
INVENTOR(S) : Yoshio Nakamura, et. al.

It is certified that error appears in the above-indentified patent and that said Letters Patent is hereby corrected as shown below:

Column 8

Line 14, "have" should be deleted.

Signed and Sealed this

Twelfth Day of March, 1996

Attest:

BRUCE LEHMAN

Attesting Officer     Commissioner of Patents and Trademarks